United States Patent [19]

Miyata et al.

[11] Patent Number: 5,622,814

[45] Date of Patent: Apr. 22, 1997

[54] METHOD FOR FABRICATING ACTIVE SUBSTRATE

[75] Inventors: Yutaka Miyata, Hirakata; Tetsuya Kawamura, Kyoto; Hiroshi Tsutsu, Osaka, all of Japan

[73] Assignee: Matsushita Electric Industrial Co., Ltd., Osaka, Japan

[21] Appl. No.: 272,634

[22] Filed: Jul. 11, 1994

Related U.S. Application Data

[63] Continuation of Ser. No. 968,479, Oct. 29, 1992, abandoned, which is a continuation of Ser. No. 758,706, Sep. 9, 1991, abandoned, which is a continuation of Ser. No. 337,892, Apr. 14, 1989, abandoned.

[30] Foreign Application Priority Data

Apr. 20, 1988 [JP] Japan ..................... 63-97008
Sep. 30, 1988 [JP] Japan ..................... 63-248197

[51] Int. Cl.⁶ ..................................... G03F 7/00
[52] U.S. Cl. .................. 430/314; 430/313; 430/317; 430/318; 430/330; 430/329; 438/30; 438/164; 438/151
[58] Field of Search ............... 430/20, 313, 314, 430/317, 318, 329, 330; 437/40, 41, 48, 51; 359/36, 87

[56] References Cited

U.S. PATENT DOCUMENTS

| | | | |
|---|---|---|---|
| 4,174,219 | 11/1979 | Andres | 430/321 |
| 4,277,884 | 7/1981 | Hsu | 430/317 |
| 4,578,343 | 3/1986 | Kosemura et al. | 430/317 |
| 4,931,351 | 6/1990 | McColgin et al. | 430/317 |
| 4,968,638 | 11/1990 | Wright et al. | 437/41 |

FOREIGN PATENT DOCUMENTS

| | | | |
|---|---|---|---|
| 59-224822 | 12/1984 | Japan | 430/20 |
| 63-58320 | 3/1988 | Japan | 430/20 |

*Primary Examiner*—Kathleen Duda
*Attorney, Agent, or Firm*—Wenderoth, Lind & Ponack

[57] ABSTRACT

A method for fabricating an active matrix substrate for forming constituent elements such as a semiconductor layer, a passivation layer, an electrode material and other elements, uses a photoresist exposed from the reverse side of the substrate, using the gate electrode pattern made of opaque material on a transparent substrate as the mask. This method contributes to lowering the cost and improving the performance of semiconductor devices.

17 Claims, 18 Drawing Sheets

METHOD FOR FABRICATING ACTIVE SUBSTRATE

This application is a Continuation of now abandoned application, Ser. No. 07/968,479, filed Oct. 29, 1992, which in turn is a Continuation of abandoned application Ser. No. 07/758,706, filed Sep. 9, 1991, and which was a Continuation of abandoned application Ser. No. 07/337,892, filed Apr. 14, 1989.

BACKGROUND OF THE INVENTION

This invention relates to a method for fabricating display devices used in liquid crystal televisions for video displays, displays for computer terminals or the like, in particular, active matrix substrates used therein.

Recently, for the purpose of application into display devices, active matrix substrates for forming thin film transistors (TFTs) on a transparent substrate are being intensively developed. The structure of such active matrix substrate is explained by referring to FIG. 14. Element 1 is a TFT comprising a polycrystalline silicon or amorphous silicon as a constituent element formed on a first transparent substrate (not shown) Element 2 is a liquid crystal disposed between a transparent pixel electrode (electrically connected to the drain electrode of the TFT 1) and a transparent counter electrode on a second transparent substrate. Elements 1 and 2 are disposed at positions corresponding to each pixel of a video display region 3, and it may be provided with, aside from the electrostatic capacity due to the liquid crystal, a capacitor formed in the active matrix substrate as a storage capacitor. Element 4 is gate bus line connected to the gate electrode of the TFT 1, and Element 5 is source bus line connected to the source electrode of the TFT 1. In FIG. 14, pixel electrodes, the TFTs, gate bus lines and source bus lines are formed on the first transparent substrate used as an active matrix substrate.

An example of the construction of the TFT which is a constituent element of such an active matrix substrate is described below by reference to FIGS. 15A and 15B. FIG. 15A is a plan view of the TFT possessing an inverted staggered structure, and FIG. 15B is an A–B sectional view of FIG. 15A. Numeral 6 is a transparent substrate made of glass, and 7 is a gate electrode. Elements 9, 10, and 11 are a gate insulator layer (first insulator layer), a first semiconductor layer and a passivation layer, respectively. Element 8 is a silicon oxide layer for preventing contact between the gate electrode 7 and a pixel electrode 15, and for enhancing the adhesion between the gate insulator layer 9 and the pixel electrode 15. Elements 13 and 14 are a drain electrode and a source electrode, respectively. Element 12 is a second semiconductor layer for achieving an ohmic contact between the first semiconductor layer 10 and electrodes which are the drain electrode 13 and the source electrode 14. Element 15 is a transparent electrode connected to the drain electrode 13, and it is a pixel electrode for applying a voltage to the liquid crystal layer. In this example, meanwhile, the pixel electrode 15 is formed beneath the gate insulator layer 9, but this pixel electrode 15 may be also formed on the gate insulator layer, simultaneously and integrally with the drain electrode 13 and source electrode 14. Incidentally, in the TFT in the inverted staggered structure, since the gate electrode serves to shut off light against the incident light from the back side of the substrate, the leakage current in an OFF state of the TFT is small, and this structure is employed widely in commercial pocket-size TV sets.

A display device using such an active matrix substrate is explained below while referring to FIG. 16. Between a counter substrate 17 to which a counter electrode 16 is adhered, and the active matrix substrate, a twisted nematic (TN) liquid crystal 18 processed by twist orientation is sealed in, and polarizer plates (not shown) are glued to one side of each of the two transparent substrates, thereby forming a display device.

As the development of such active matrix substrates becomes intensive, it gives rise to the necessity of forming such active matrix substrates on a large substrate in a range of scores of centimeters at a high yield. At the same time, it is also necessary to fabricate the elements at a high density. In the fabrication of active matrix substrates, therefore, it is necessary to process finely and precisely by using exposure machines having the same performance level as that for semiconductor processes, and attachments such as the alignment mechanism of high precision. That is, conventionally, to form such an active matrix substrate as shown in FIGS. 15A and 15B, five or six photolithographic processes using photomasks are required.

Such a forming method involves several problems as mentioned below in the aspects of cost, yield and performance. First of all, the greater the number of photolithography steps, the more that high performance and expensive exposure machines other machines must be used, which results in a higher cost for forming the active matrix substrate. Besides, the more the number of photolithography steps, the more the amount of troubles may occur in the photolithographic processes (such as misalignment between patterns), and the yield is lowered accordingly. As the substrate material, meanwhile, pyrex and other glass materials are often used, and the strain of the substrate caused by the thermal expansion and contraction during processing or the stress of the thin film may become too large to be ignored (in particular, this problem is serious in a large substrate, and mismatching between patterns on the substrate formed by a photomask may often exceed 10 microns). As a result, the alignment precision is not uniform within a substrate, and uniformity of the device characteristics decreases, or it may be necessary to use a special apparatus for correcting this strain or to design the device with a special consideration in a margin taking such strain into account. In addition to the substrate strain, the greater the number of times of that photomask matching becomes necessary for realizing the device, the larger the device size becomes for keeping the margin. As a result, the aperture ratio (the ratio of effective display region) is lowered. Such phenomena are greater problems when the device density is higher and when the substrate is large. There are also other problems to be solved, such as enhancement of the element capacity.

SUMMARY OF THE INVENTION

It is hence a primary object of this invention, in the light of the above problems, to present a method for fabricating active matrix substrates at a lower cost, by curtailing the photolithographic processes which require precise alignment of the photomasks. It is another object of this invention to enhance the performance of the element by employing photolithographic processes which do not require precise alignment of the photomasks.

To achieve the above objects, for example, this invention presents a method for fabricating an active matrix substrate for sequentially forming, on a transparent substrate, a gate electrode made of an opaque material covering a specific region on the substrate surface, a first insulator layer for covering the exposed surface of the substrate surface and the gate electrode, a semiconductor layer for covering a specific region on the insulator layer, and source electrode and drain electrode of the semiconductor layer, which comprises at least a step of coating a photoresist on the substrate with a gate electrode, a step of irradiating light from the back side of the substrate, a step of developing the photoresist, and a step of processing the element by using the photo resist. That is, to realize a gate electrode pattern, a resist pattern aligned at such a high precision that cannot be realized in the conventional exposure machine is formed on the substrate, and by using it the semiconductor layer of the desired element, passivation layer, and various constituent elements such as electrode materials are fabricated and processed.

According to the method of this invention, for example, when forming the pattern of semiconductor layer, since photolithography is possible by using the gate electrode (or gate electrode and insulated conductor layer) as the mask, an inexpensive exposure machine not requiring the alignment mechanism may be used. Or, depending on the cases, the number of photolithography steps may be curtailed, which contributes to reduction of cost and an increase of yield in the production of active matrix substrate. Or when irradiating light from the back side, there is no effect of expansion or contraction of the substrate, and a correctly aligned resist pattern will be obtained. Therefore, by using it, it may be possible to reduce the size of the TFT, and an active matrix substrate of a high aperture ratio of a high density may be realized. Besides, the device performance may be enhanced, and a high performance inverted staggered type TFT can be realized.

While the novel features of the invention are set forth in the appended claims, the invention, both as to organization and content, will be better understood and appreciated, along with other objects and features thereof, from the following detailed description taken in conjunction with the drawings.

BRIEF DESCRIPTION OF THE DRAWINGS

FIGS. 1A–1E, FIGS. 2A–2E, FIGS. 4B to 4E, and FIGS. 5A to FIG. 13D are process sectional views showing the method for fabricating active matrix substrates in accordance with first, second, and fourth to thirteenth embodiments of the present invention, respectively;

FIG. 4A is a plan view of an active matrix substrate obtained in accordance with a fourth embodiment of the invention;

DETAILED DESCRIPTION OF THE INVENTION

Figure 1A:
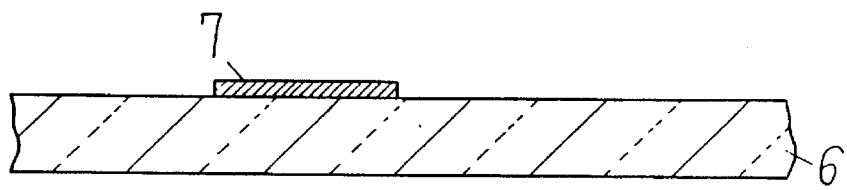

Referring now to the drawings, preferred embodiments of the invention are described in details below.

EXAMPLE 1

FIGS. 1A–1E illustrate the steps of a first embodiment in accordance with present invention.

Figure 1B:
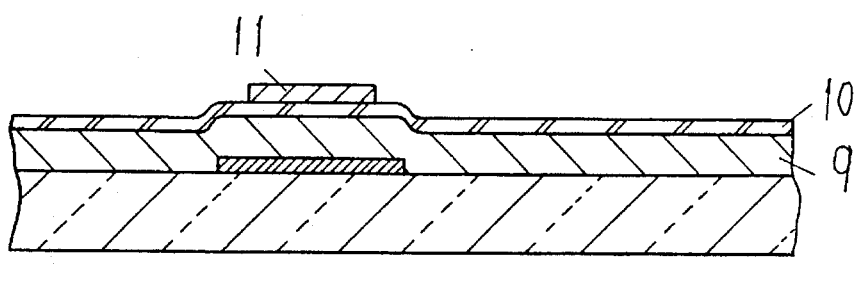
Figure 1C:
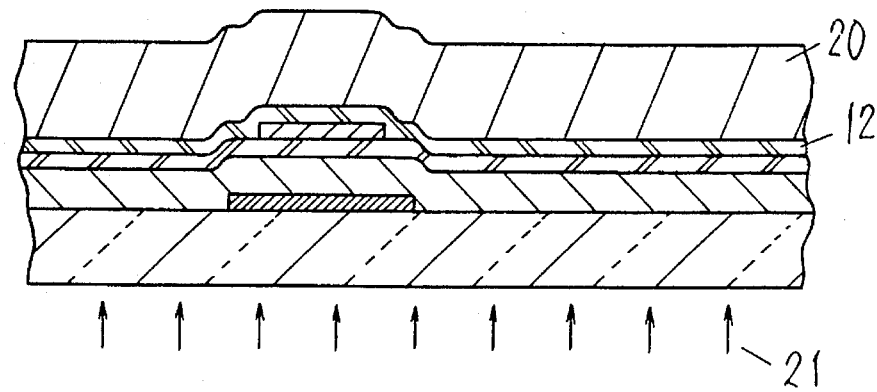
Figure 1D:
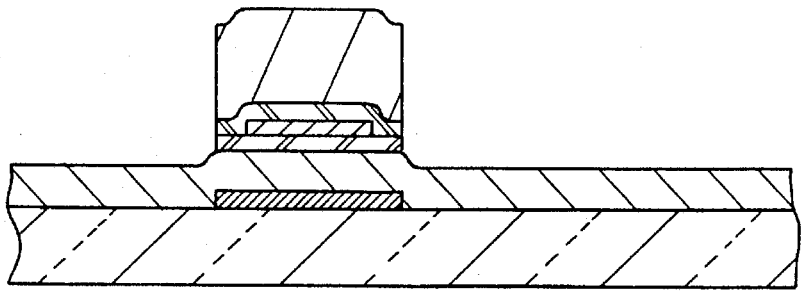
Figure 1E:
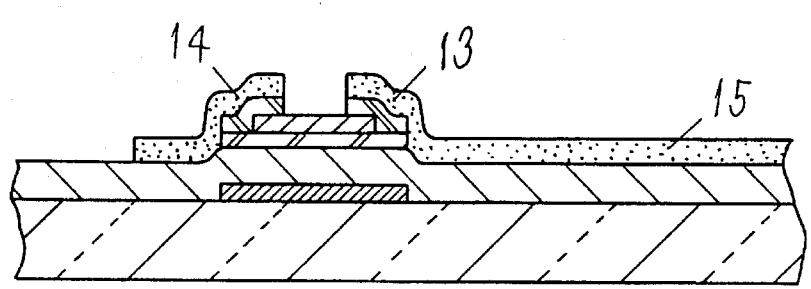

On a transparent substrate (for example, Corning Glass 7059) 6, an opaque conductor thin film (for example, Cr; film thickness approx. 100 nm) is deposited by sputtering, and a gate electrode 7 is formed by a desired patterning (FIG. 1A). By a plasma enhanced CVD process, a gate insulator layer (first insulator layer, for example, silicon nitride; film thickness approx. 380 nm) 9, a first semiconductor layer (for example, amorphous silicon; film thickness approx. 50 nm) 10, and a passivation layer (for example, silicon nitride; film thickness approx. 80 nm) 11 are sequentially and uniformly deposited, and then the passivation layer 11 is etched, leaving only a part above the gate electrode 7 (FIG. 1B). Next, by a plasma enhanced CVD process, again, a second semiconductor layer (for example, phosphorus-doped low resistance amorphous silicon; film thickness approx. 50 nm) 12 is applied, and a positive type photoresist 20 is then coated thereon. After prebaking the resist, ultraviolet ray 21 are irradiated from the back side of the transparent substrate 6, using the gate electrode 7 as the mask (FIG. 1C). When the resist on the substrate is developed, the resist is removed, except for the portion corresponding to the gate electrode 7. After postbaking the resist, using this patterned resist as the etching mask, the exposed areas of the first semiconductor layer 10 and second semiconductor layer 12 are removed by etching (FIG. 1D). After removing the resist, a thin film composed of transparent conductive material (for example, indium tin oxide (ITO); film thickness approx. 400 nm) is deposited, and is patterned, and a drain electrode 13, a source electrode 14, and a pixel electrode 15 are formed (FIG. 1E), so that an active matrix substrate is completed.

As shown in this embodiment, by performing photolithography using the gate electrode 7 as the mask when forming the pattern of a semiconductor layer, an inexpensive exposure machine not requiring an alignment mechanism can be used, and the number of photolithography steps may be reduced, too. Besides, since the semiconductor layer is not spreading wider than the gate electrode, the size of the device may be reduced. In this embodiment, meanwhile, the pixel electrode, source electrode and drain electrode are formed simultaneously, but they may be also formed separately.

EXAMPLE 2

FIGS. 2A–E show a second embodiment in accordance with the present invention.

Figure 2:
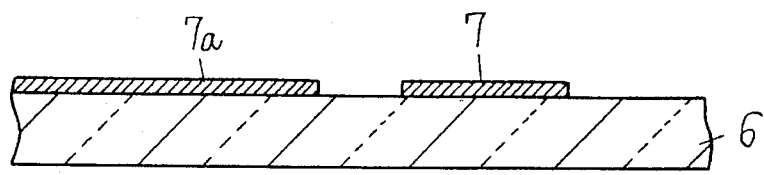
Figure 2:
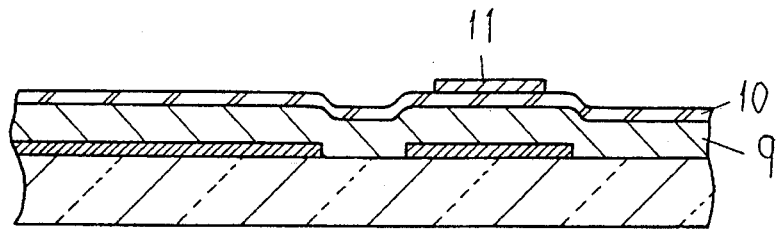
Figure 2:
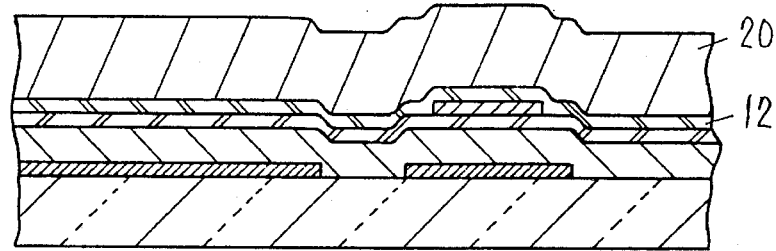
Figure 2:
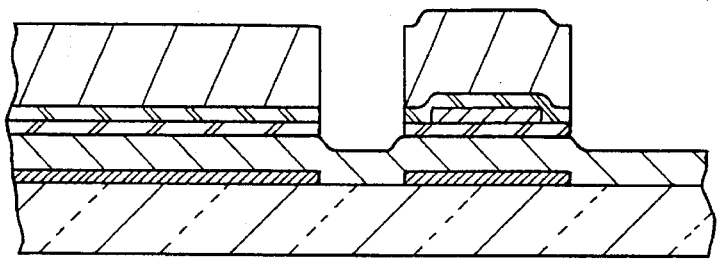
Figure 2:
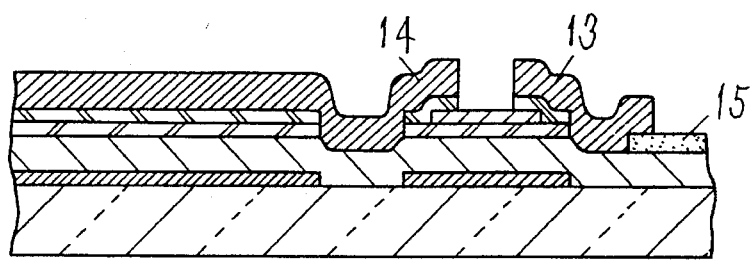

On a light transmissible substrate 6, an opaque conductor thin film is deposited by sputtering, and by patterning as desired, a gate electrode 7 and an insular conductor layer 7a are formed (FIG. 2A). By a plasma enhanced CVD process, a gate insulator layer (first insulator layer) 9, a first semiconductor layer 10, and a passivation layer 11 are sequentially deposited, and the passivation layer 11 is etched, leaving only a part above the gate electrode 7 (FIG. 2B). Then, after depositing a second semiconductor layer 12 also by a plasma enhanced CVD process, a positive type photoresist 20 is coated thereon. After prebaking the resist, ultraviolet rays 21 are irradiated from the back side of the transparent substrate 6, using the gate electrode 7 and insular conductor layer 7a as the mask (FIG. 2C). When the resist on the substrate is developed, the resist is removed except for the portion corresponding to the gate electrode 7 and insular conductor layer 7a. After postbaking the resist, using this resist as the mask, the exposed areas of the first semiconductor layer 10 and second semiconductor layer 12 are etched (FIG. 2D). After removing the resist, when a transparent electrode used as pixel electrode 15, drain electrode 13, and source electrode 14 are formed (FIG. 2E), an active matrix substrate is completed.

As shown in this embodiment, by forming the semiconductor layer in the great part of the region beneath the source bus line, the redundancy of the source bus line is increased, and disconnection of the source bus line may be prevented.

EXAMPLE 3

Figure 3:
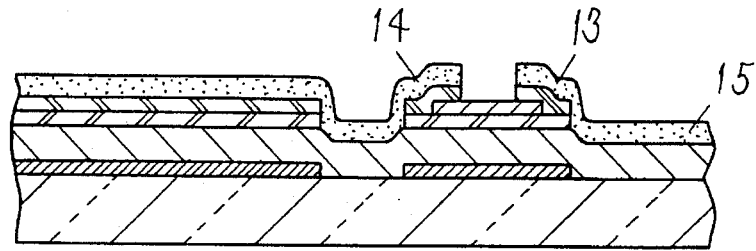
FIG. 3 is a sectional view of an active matrix substrate obtained in accordance with a third embodiment of the invention.

FIG. 3 shows a third embodiment in accordance with the present invention.

After etching the semiconductor layer in the same manner as in Example 2 (FIGS. 2A to 2D), the resist is removed. Then, a transparent electrode layer is deposited and patterned to form drain electrode 13, source electrode 14 and pixel electrode 15 (FIG. 3), and an active matrix substrate is completed.

Thus, in this embodiment, by forming the pixel electrode, source electrode and drain electrode simultaneously, one photolithography step can be omitted.

EXAMPLE 4

Figure 4:
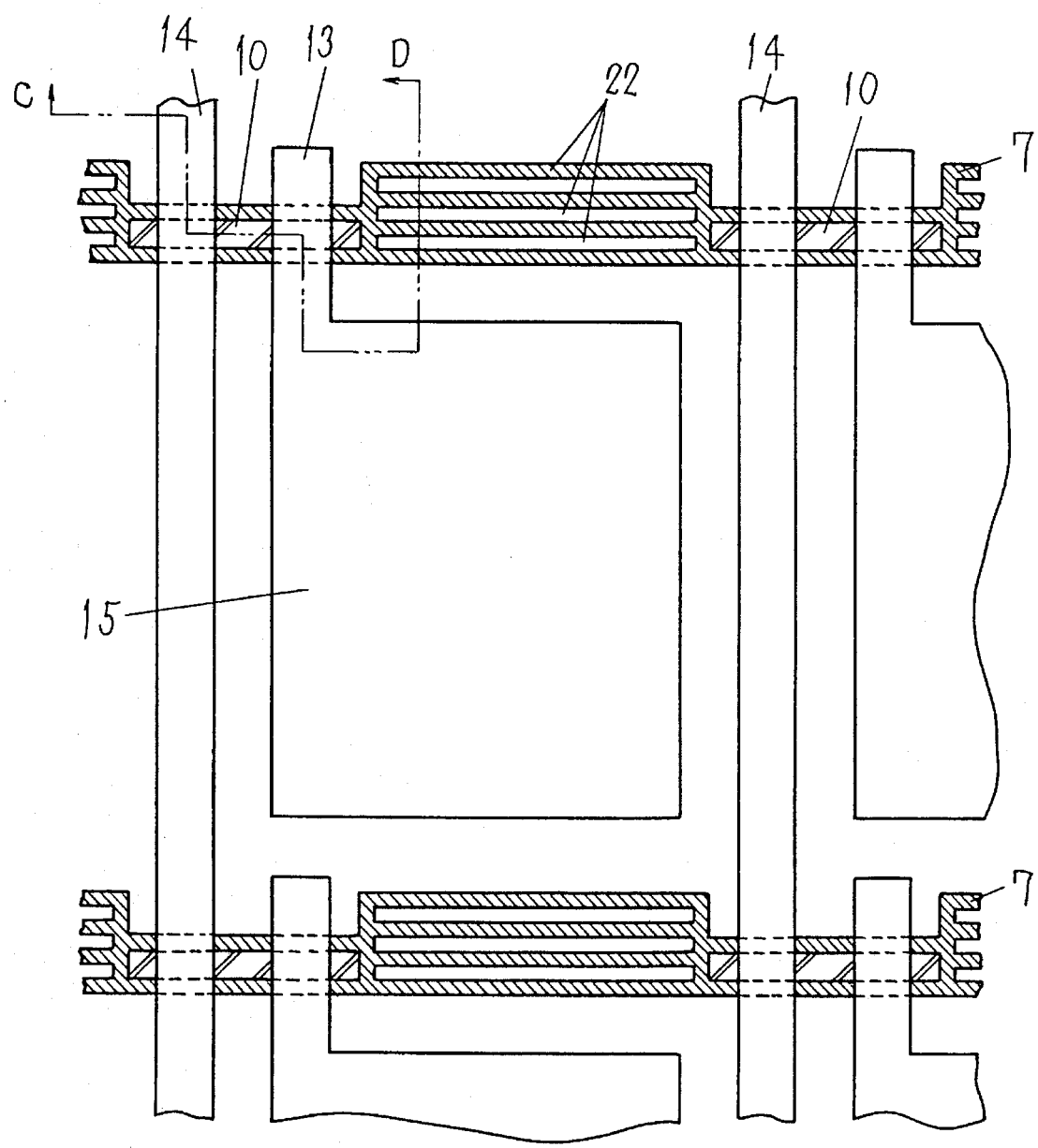
Figure 4B:
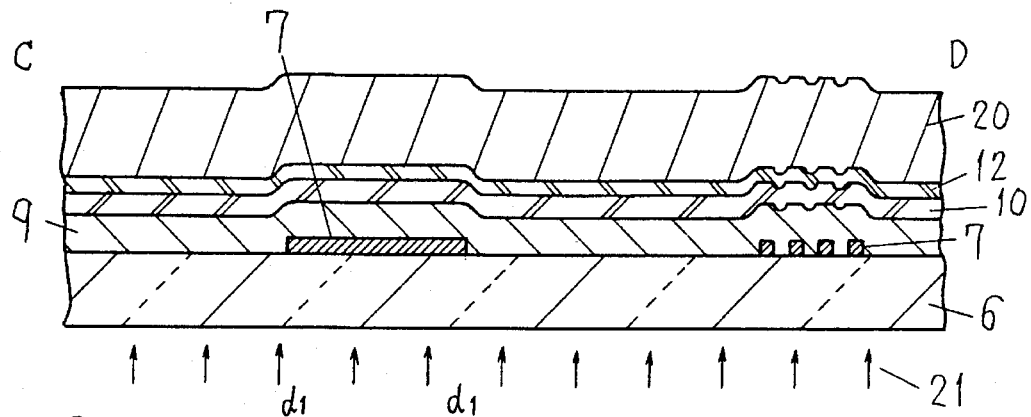

FIG. 4 shows a fourth embodiment in accordance with the present invention.

Figure 4C:
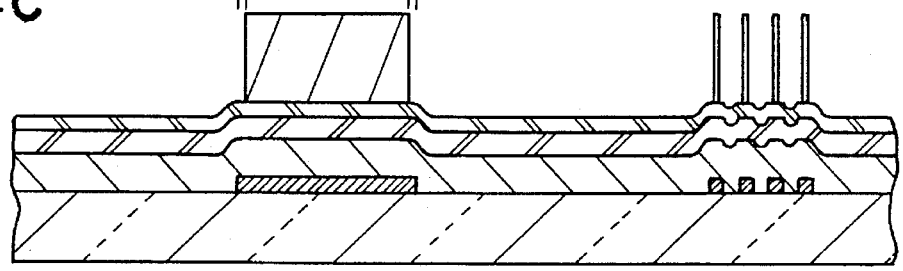
Figure 4D:
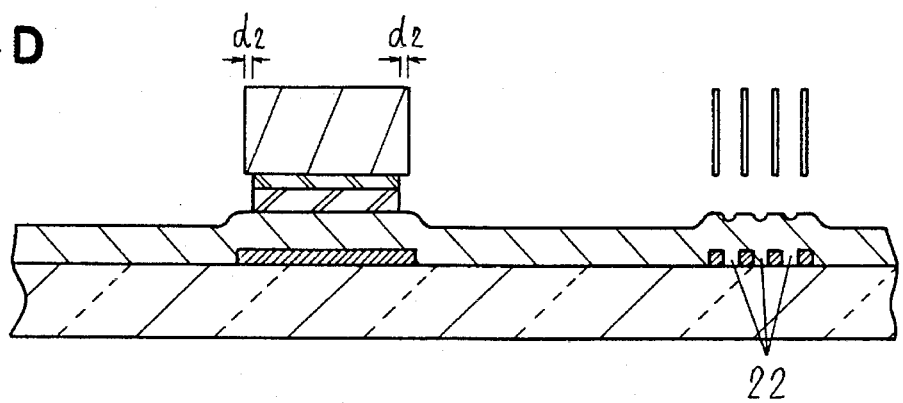
Figure 4E:
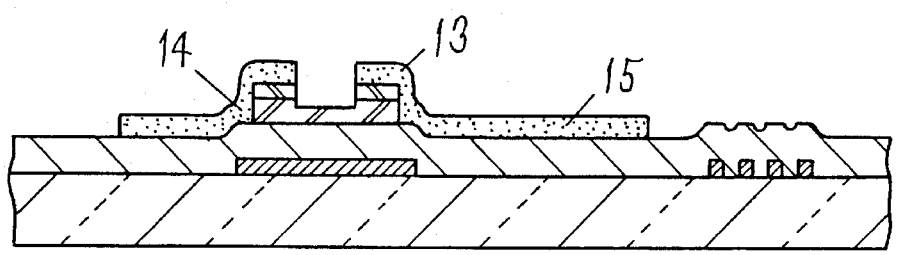

FIG. 4A is a plan view of essential part of the active matrix array substrate in accordance with the fourth embodiment of the present invention, showing one pixel and its surrounding parts. Element 7 is a gate electrode Element 14 is a source electrode Element 13 is a drain electrode, and Element 15 is a pixel electrode. Slits 22 are provided in the gate electrode. FIGS. 4B to 4E are sectional views following step by step along the broken line CD in FIG. 4A. On a transparent substrate, a gate electrode 7 of a metal thin film is patterned and formed by using a first photo mask, and a gate insulator layer 9, a first semiconductor layer 10 and a second semiconductor layer 12 are continuously formed thereon. In this state, a positive type photoresist 20 is coated thereon, and ultraviolet rays 21 are irradiated from the back side of the substrate (FIG. 4B), and the resist on the substrate is developed. At this time, by overexposure, the resist pattern is thinned out by the portion of d1 from the gate electrode 7 (FIG. 4C). Using this resist, furthermore, the first semiconductor layer 10 and second semiconductor layer 12 are etched. At this time, by overetching the etching pattern is thinned out by the portion of d2 from the resist pattern. By the effect of overexposure and overetching (d1+d2), the semiconductor layer is not left over on the gate wiring 7 around the slits 22 (FIG. 4D). By removing the resist, a transparent conductive layer is deposited, and patterning is effected by using a second photomask, and the source electrode 14, drain electrode 13, and picture element electrode 15 are formed simultaneously. At this time, the second semiconductor layer is etched except for the portion of the second photo mask pattern (FIG. 4E).

In this embodiment, as shown in FIG. 4A, a TFT whose first semiconductor layer 10 is completely separated between adjacent TFTs is completed by using two photomasks.

In the conventional structure, separation of devices (separation of semiconductor layers) was required by some method or other, but when the active matrix array substrate is-formed in the method shown herein, a photolithography step for the separation of devices may be saved.

EXAMPLE 5

FIGS. 5A–5D show a fifth embodiment in accordance with the present invention.

Figure 5:
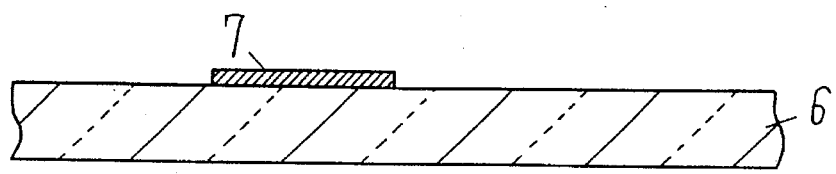
Figure 5:
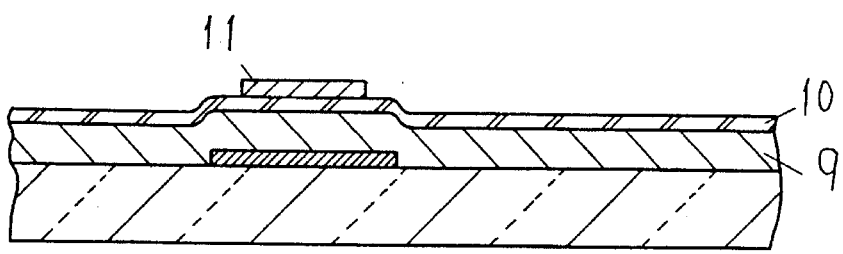
Figure 5:
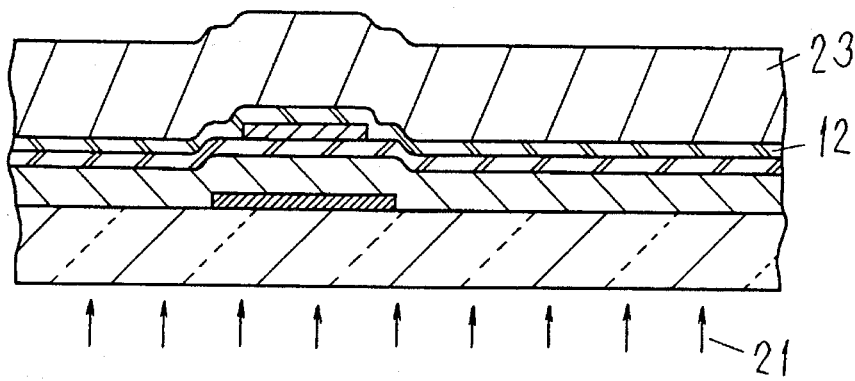
Figure 5:
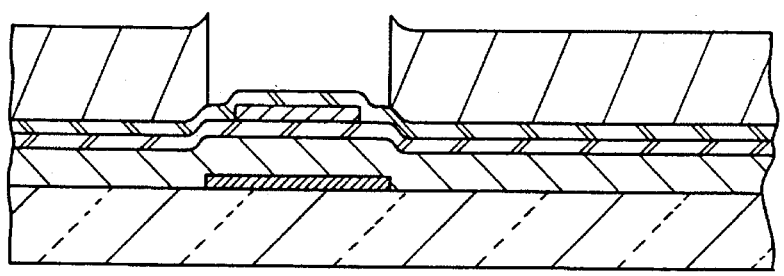
Figure 5:
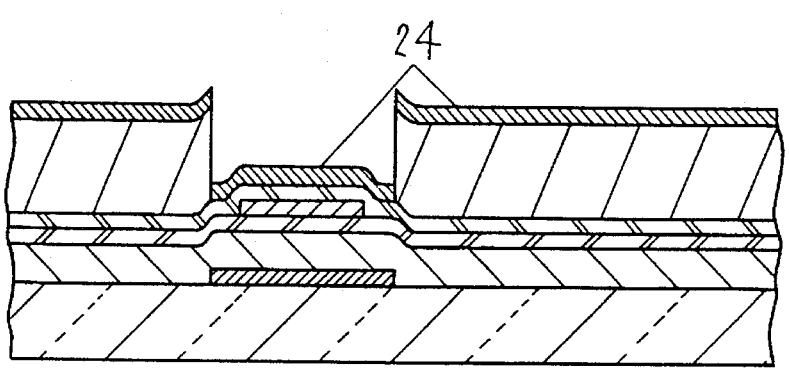
Figure 5:
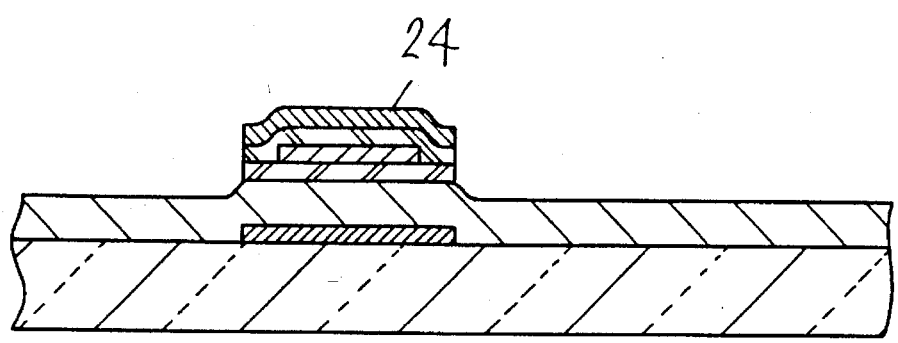
Figure 5:
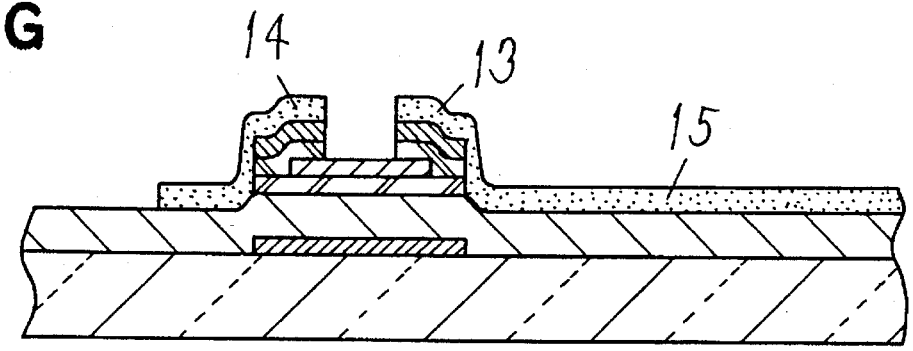

As in Example 1, on a transparent substrate 6, a gate electrode 7, a gate insulator layer (first insulator layer) 9, a first semiconductor layer 10, a passivation layer 11, and a second semiconductor layer 12 are formed, and a negative type photoresist 23 is coated over the entire surface thereof. After prebaking the resist, ultraviolet rays 21 are irradiated from the back side of the transparent substrate 6 using the gate electrode 7 as the mask (FIGS. 5A to 5C). When this resist on the substrate is developed, only the resist in the portion corresponding to the gate electrode 7 is removed (FIG. 5D). Next, a conductor layer 24 is deposited (FIG. 5E), and the resist is removed, an then the conductor layer 24 except for the portion above the gate electrode 7 is removed together with the resist. Using this conductor layer 24 as the etching mask, the first semiconductor layer 10 and second semiconductor layer 12 are etched (FIG. 5F). Next, a transparent conductive layer is deposited and patterned to form a drain electrode 13, a source electrode 14 and a pixel electrode 15, and then an active matrix substrate is completed (FIG. 5F).

As shown in this embodiment, by performing photolithography using the gate electrode 7 as the mask when forming the pattern of the semiconductor layer, an inexpensive exposure machine not requiring an alignment mechanism can be used. At the same time, the number of photolithography steps may be reduced. In this constitution, moreover, part of the source and drain electrodes become two-layer arrangements, and the lowering of resistance of the electrodes and the prevention of the disconnection of the electrodes may be realized.

EXAMPLE 6

FIGS. 6A–6G show a sixth embodiment in accordance with the present invention.

Figure 6:
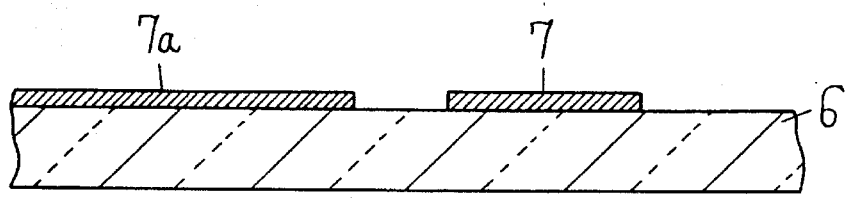
Figure 6:
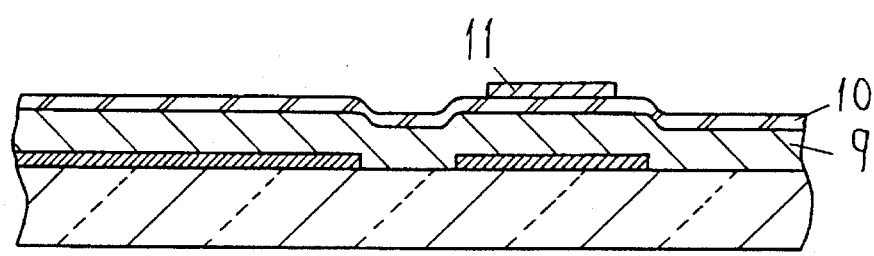
Figure 6:
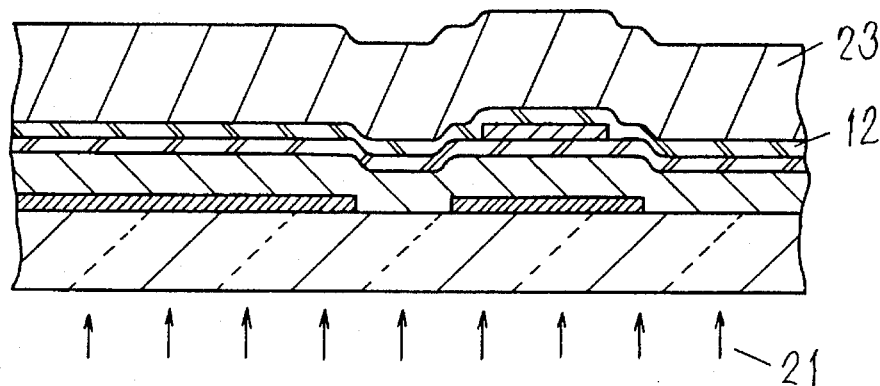
Figure 6:
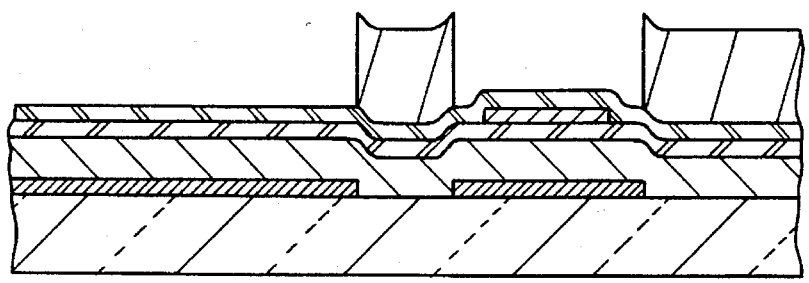
Figure 6:
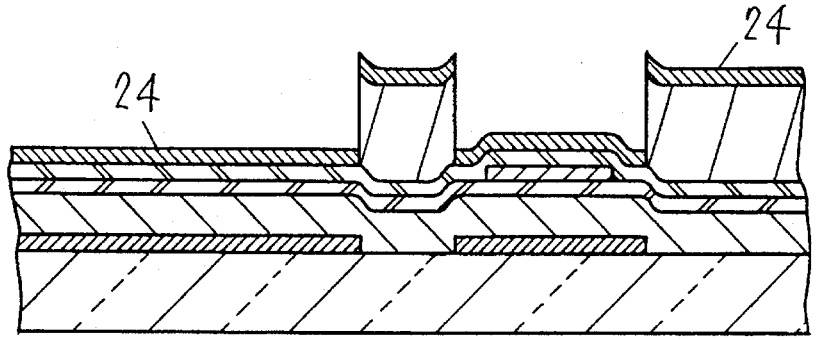
Figure 6:
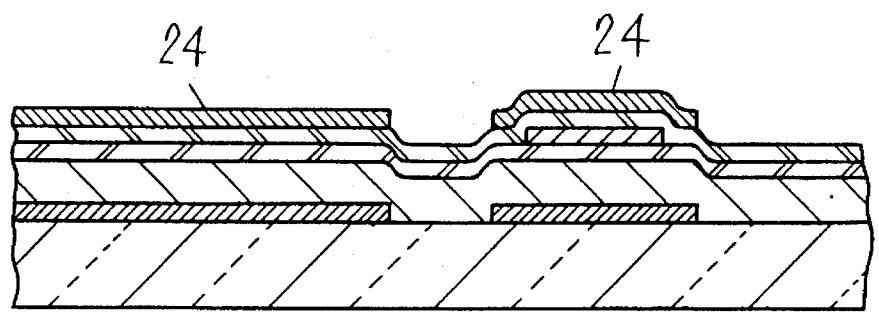
Figure 6:
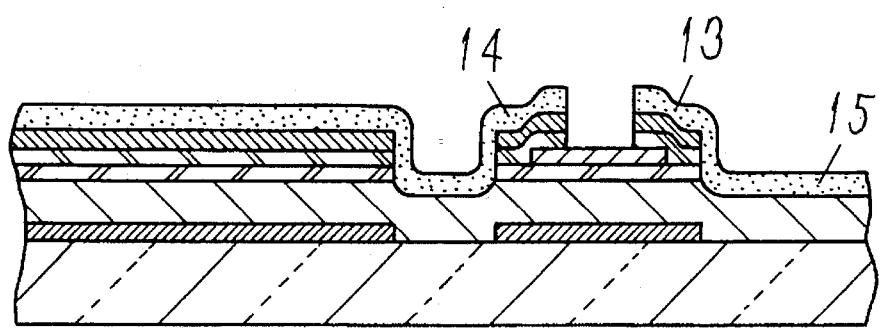

As in Example 2, on a transparent substrate 6, a gate electrode 7, an insulated conductor layer 7a, a gate insulator layer (first insulator layer) 9, a first semiconductor layer 10, a passivation layer 11, and a second semiconductor layer 12 are formed, and a negative type photoresist 23 is coated over the entire surface thereof. After prebaking the resist, ultraviolet rays 21 are irradiated from the back side of the transparent substrate 6 using the gate electrode 7 and insulated conductor layer 7a as the mask (FIGS. 6A to C). By developing the resist on the substrate, the resist is removed only in the portions corresponding to the gate electrode 7 and insulated conductor layer 7a (FIG. 6D). Next, a conductor layer 24 is deposited (FIG. 6E), and the resist is removed, so that the conductor layer 24 is removed together with the resist except for the portion corresponding to the gate electrode 7 and insulated conductor layer 7a (FIG. 6F). Using this conductor layer 24 as the etching mask, the first semiconductor layer 10 and second semiconductor layer 12 are patterned, and a transparent conductive layer is deposited and patterned to form a drain electrode 13, a source electrode 14 and a pixel electrode 15, thereby completing an active matrix substrate (FIG. 6G).

Thus, according to this embodiment, by performing photolithography using the gate electrode 7 as the mask when forming patterns of the semiconductor layer, an inexpensive exposure machine not requiring an alignment mechanism may be used, and the number of photolithography steps may be reduced. In addition, by forming the conductor layer 24 and semiconductor layer in the great part of the region beneath the source bus line, the redundancy of the source bus line increases along with lowering of its resistance, so that the disconnection of the source bus line may be prevented.

Incidentally, as the material of the conductor layer 24 in Examples 5 and 6, Cr, Ta, Ti, Mo, Ni and their alloys, or silicides of these metals may be used.

EXAMPLE 7

FIGS. 7A–7E show a seventh embodiment in accordance with the present invention.

Figure 7A:
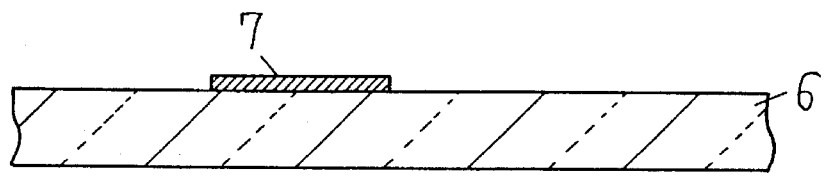
Figure 7B:
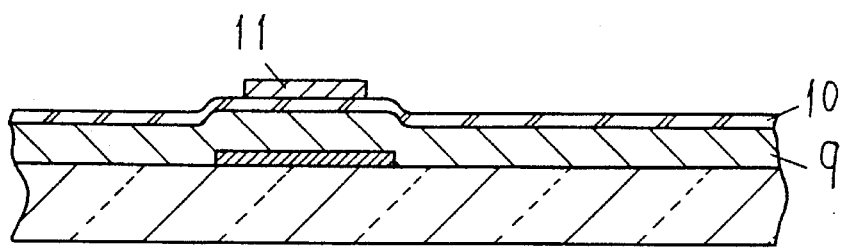
Figure 7C:
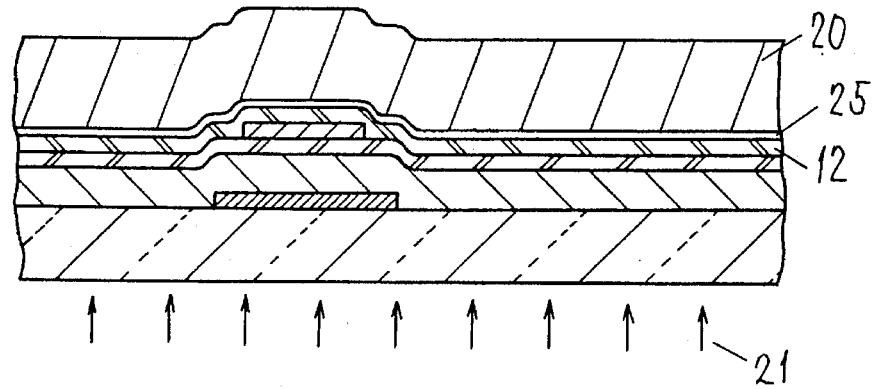
Figure 7D:
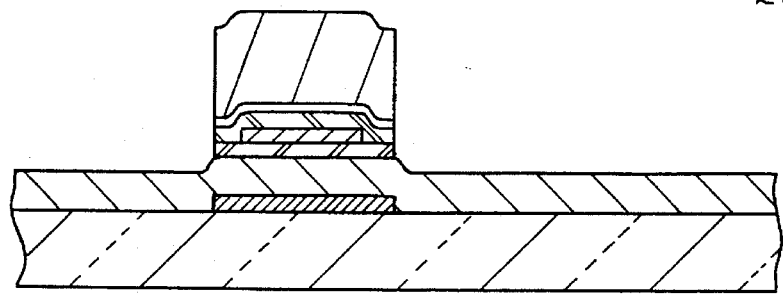
Figure 7E:
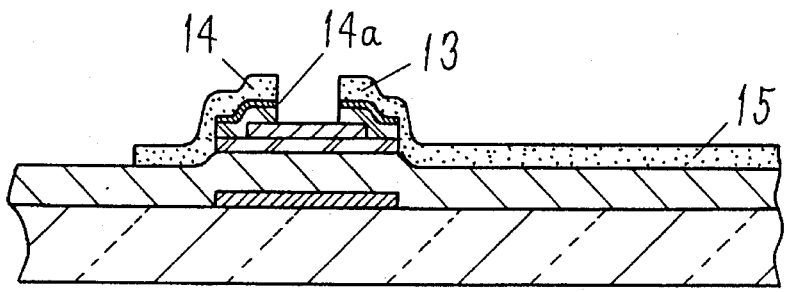
Figure 8A:
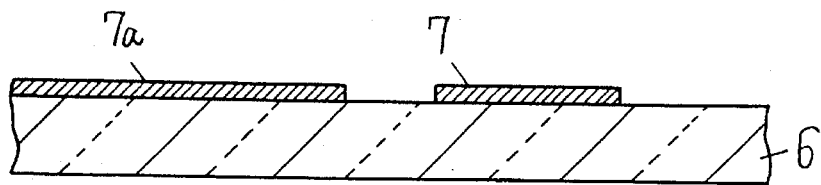
Figure 8B:
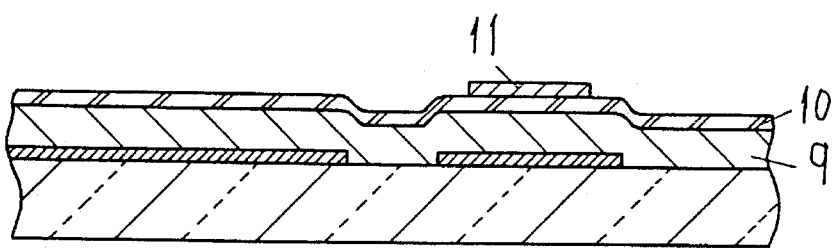
Figure 8C:
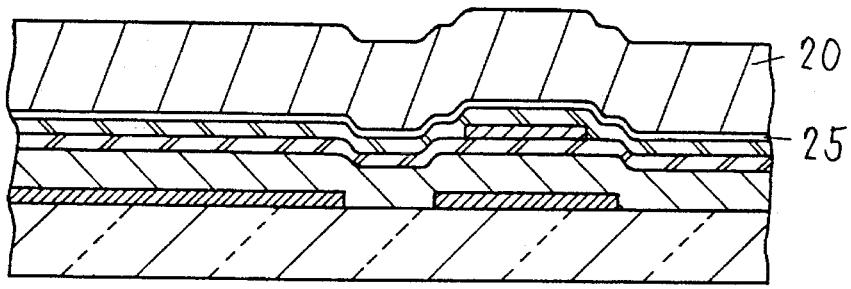
Figure 8D:
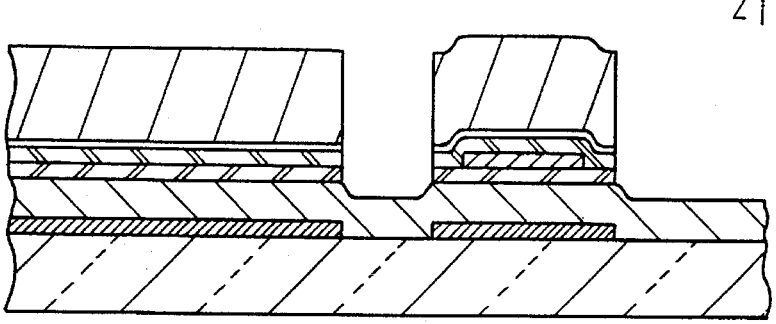
Figure 8E:
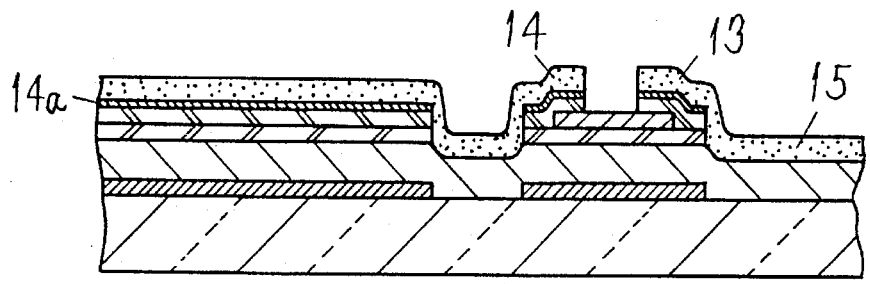

Same in Example 1, on a transparent substrate 6, a gate electrode 7, a gate insulator layer (first insulator layer) 9, a first semiconductor layer 10, a passivation layer 11, and a second semiconductor layer 12 are formed, and a metal oxide 25 is deposited, and a positive type photoresist 20 is coated over the entire surface thereof. After prebaking the resist, ultraviolet rays 21 are irradiated from the back side of the transparent substrate 6 using the gate electrode 7 as the mask (FIGS. 7A to 7C). When this resist on the substrate is developed, the resist is removed except for the portion corresponding to the gate electrode 7. After postbaking the resist, using this resist as the mask, the exposed areas of the metal oxide 25, first semiconductor layer 10 and second semiconductor layer 12 are etched away (FIG. 7D). After removing the resist, when the substrate is exposed to a hydrogen plasma atmosphere, the metal oxide 25 is reduced to become a metal layer 14a. Finally, when a transparent electrode as a pixel electrode used 15, and a drain electrode 13 and a source electrode 14 are formed (FIG. 7E), an active matrix substrate is completed.

In this embodiment, as shown herein, the performance of the element may be enhanced without increasing the number of photolithography steps using a photomask. That is, by inserting a metal oxide between the source electrode and drain electrode and the semiconductor layer, and reducing it to a metal, the resistances of both electrodes may be lowered, and the contact resistance between the source electrode and the semiconductor layer and the contact resistance between the drain electrode and the semiconductor layer may be lowered (conventionally, the contact resistance between the second semiconductor layer and the transparent electrode material of the metal oxide was often a problem, and it is improved herein).

EXAMPLE 8

FIGS. 8A–8E show an eighth embodiment in accordance with the present invention.

On a transparent substrate 6, a gate electrode 7 and an insulated conductor layer 7a are formed, and the rest of the procedure is same as in Example 7, and an active matrix substrate is completed (FIGS. 7A to 7E).

In this embodiment, by forming the semiconductor layer and metal layer in the great part of the region beneath the source bus line, the redundancy of the source bus line is increased, and the disconnection of the source bus line may be prevented. Besides, by the metal layer 14a reduced from the metal oxide, the resistance of the source and drain electrodes is lowered, and the contact resistance between the source electrode and the semiconductor layer and the contact resistance between the drain electrode and the semiconductor layer may be lowered.

In Examples 7 and 8, as the metal oxide 25, TaOx and ITO may be adequately used. As the reducing method, instead of the hydrogen plasma processing, other methods such as exposure in a hydrogen atmosphere may be equally employed. Anyway, better results are obtained when the substrate is processed in a hydrogen atmosphere or a hydrogen plasma atmosphere.

EXAMPLE 9

FIGS. 9A–9F show a ninth embodiment in accordance with the present invention.

Figure 9A:
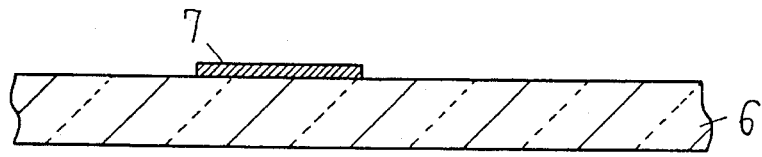
Figure 9B:
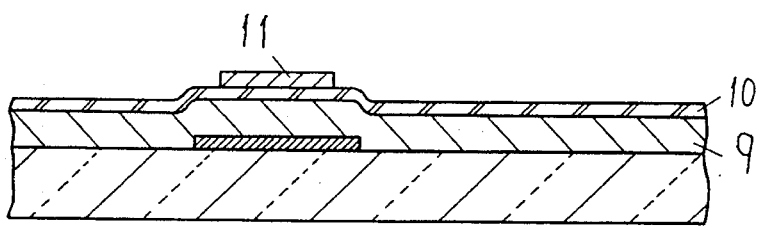
Figure 9C:
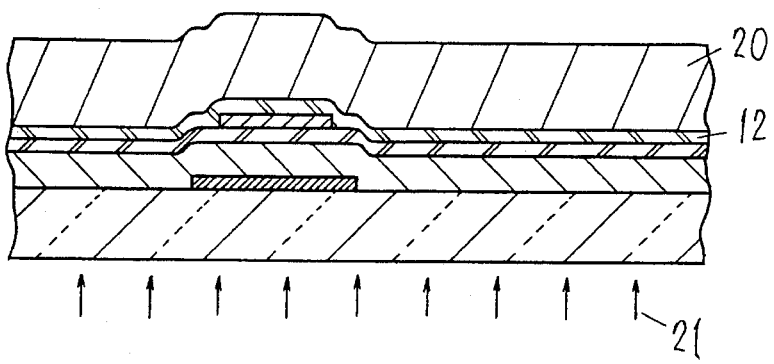
Figure 9D:
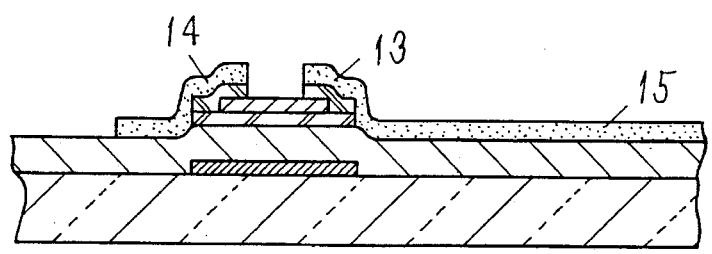
Figure 9E:
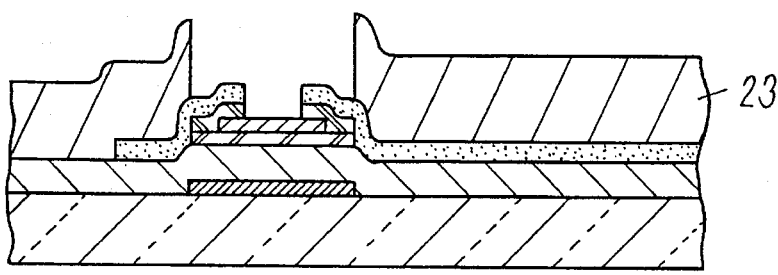
Figure 9F:
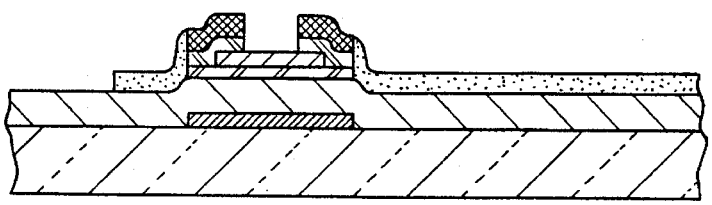

As in Example 1, on a transparent substrate 6, a gate electrode 7, a gate insulator layer (first insulator layer) 9, a first semiconductor layer 10, a passivation layer 11, and a second semiconductor layer 12 are formed, and a positive type photoresist 20 is coated over the entire surface thereof, and ultraviolet rays 21 are irradiated from the back side of the transparent substrate 6 using the gate electrode 7 as a mask (FIGS. 9A to 9C). After developing this resist, the exposed areas of the first semiconductor layer 10, and the second semiconductor layer 12 are etched. Next, a metal oxide film composed of at least one layer of a metal oxide film, for example, 90% $In_2O_3$—10% $SnO_2$ is deposited, and patterned to form a drain electrode 13, a source electrode 14, and a pixel electrode 15 (FIG. 9D). On this, a negative type photo resist 23 is coated, and ultraviolet rays are irradiated from the back side of the transparent substrate 6 using the gate electrode 7 as a mask. After developing the resist (FIG. 9E), the substrate is exposed to a hydrogen plasma atmosphere, and parts of the drain electrode 13 and source electrode 14 are reduced to become In—Sn. When the resist is removed, an active matrix substrate is completed (FIG. 9F).

Thus, in this embodiment, by reducing the source electrode and drain electrode to transform them into metals, both electrodes may be lowered in resistance, and the contact resistance between the source electrode and the semiconductor layer and the contact resistance between the drain electrode and the semiconductor layer may be lowered.

EXAMPLE 10

FIGS. 10A–10D show a tenth embodiment of the invention.

Figure 10:
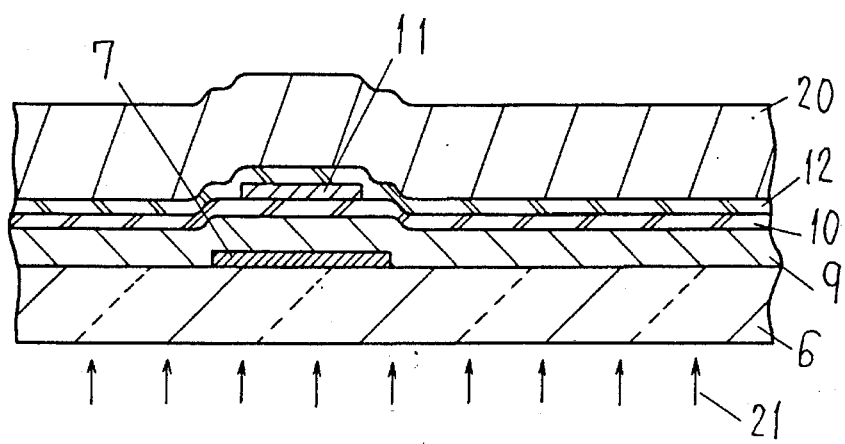
Figure 10:
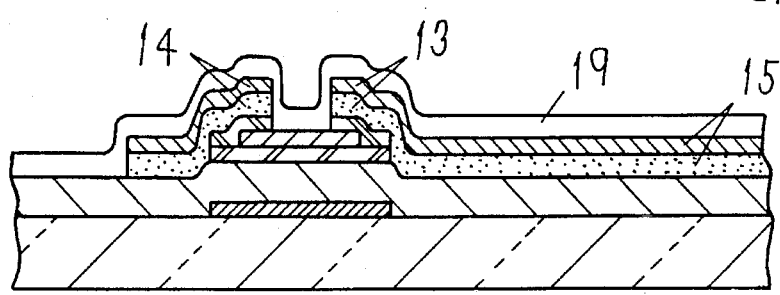
Figure 10:
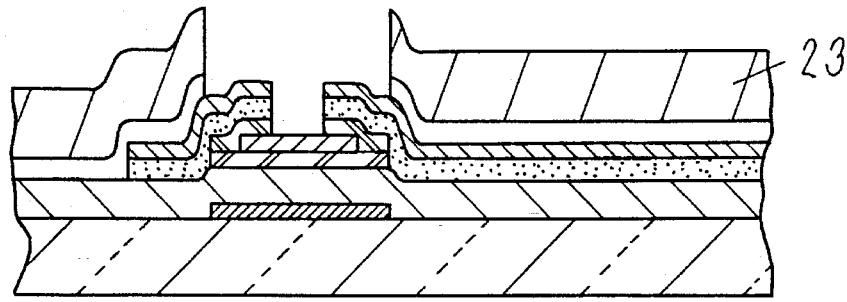
Figure 10:
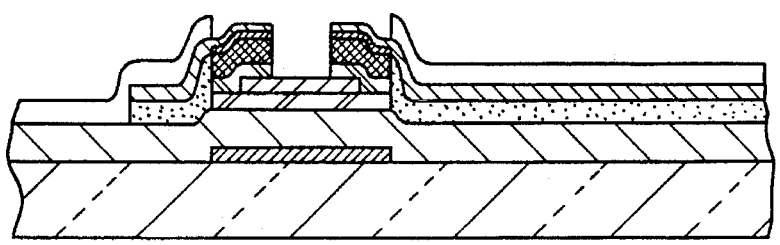

As in Example 1, on a tranparent substrate 6, a gate electrode 7, a gate insulator layer (first insulator layer) 9, a first semiconductor layer 10, a passivation layer 11 and a second semiconductor layer 12 are formed, and a positive type photoresist 20 is coated over the entire surface thereof, and ultraviolet rays 21 are irradiated from the back side of the transparent substrate 6 using the gate electrode 7 as a mask (FIG. 10A). After developing this resist, exposed areas of the first semiconductor layer 10 and the second semiconductor layer 12 are etched. A two-layer metal oxide film composed of at least one metal oxide film such as 90% $In_2O_3$—10% $SnO_2$, and $Ta_2O_5$ is deposited (the side contacting the semiconductor is 90% $In_2O_3$—10% $SnO_2$), and a patterned, and drain electrode 13, a source electrode 14 and a pixel electrode 15 are formed, and a second insulator layer 19 is deposited thereon (FIG. 10B). On this, furthermore, a negative type photoresist 23 is coated, and ultraviolet rays are irradiated from the back side of the transparent substrate 6 using the gate electrode 7 as a mask. By developing the resist, the portion not covered by the resist of the second insulator layer 19 is etched (FIG. 10C), and the substrate is exposed to a hydrogen plasma atmosphere, then the metal oxide films of the drain electrode 13 and the source electrode 14 are reduced to form a two-layer metal film composed of In—Sn and Ta. At this time, when the active matrix substrate is exposed to an oxygen plasma atmosphere or oxidized anodically, the surface layer of the reduced drain electrode 13 and source electrode 14 are again oxidized to form an insulation layer, and when the resist is removed, an active matrix substrate is completed (FIG. 10D).

In this embodiment, thus, by reducing the source electrode and drain electrode to transform them into metals, both electrodes are lowered in resistance, while the contact resistance between the source electrode and the semiconductor layer and the contact resistance between the drain electrode and the semiconductor layer are lowered at the same time. Besides, by oxidizing the surface, insulation layers of the both electrode surfaces and the second insulator layer 19 become the passivation layers of the active matrix substrate.

In Examples 9 and 10, meanwhile, as the materials for drain electrode, source electrode and pixel electrode, 90% $In_2O_3$—10% $SnO_2$ or 90% $In_2O_3$—10% $SnO_2$, and $TaO_5$ are used, but other materials which show conductivity when reduced may be similarly applied. Anyway, better results will be obtained when one or more metal oxides selected from a group consisting of In, Sn, Cd, Zn, Nb, Ti and Ta are employed.

Besides, in Examples 9 and 10, the drain electrode and the source electrode are reduced by processing in hydrogen plasma, but it may also be possible to reduce them by exposing to a hydrogen atmosphere or the like. However, the best results will be obtained by hydrogen plasma processing.

EXAMPLE 11

FIGS. 11A–11D illustrate an eleventh embodiment in accordance with the present invention.

Figure 11A:
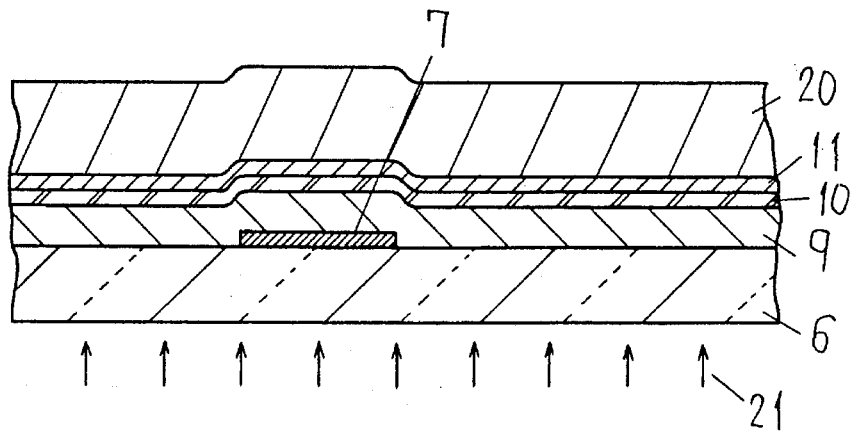
Figure 11B:
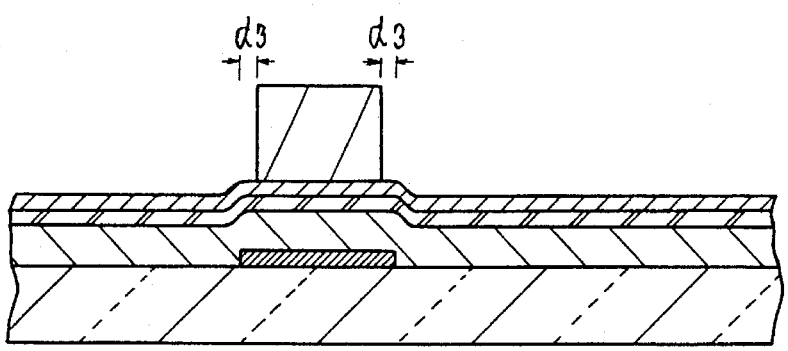
Figure 11C:
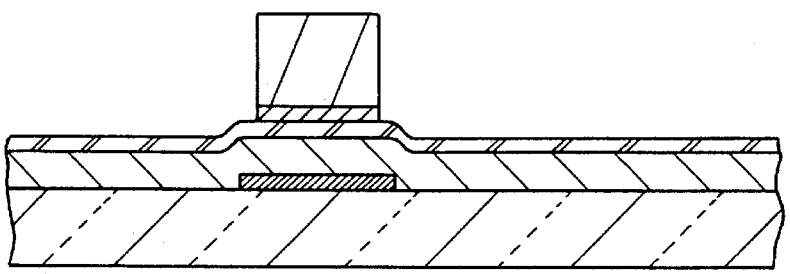
Figure 11D:
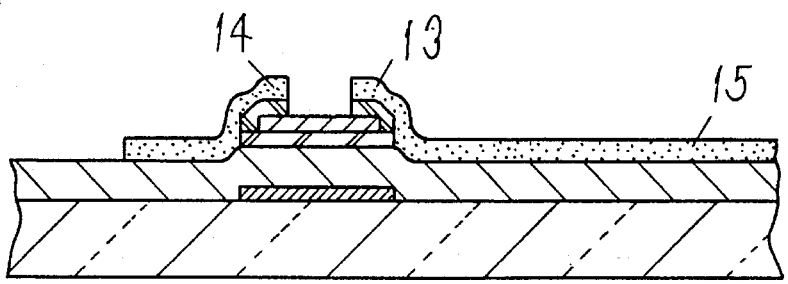

On a transparent substrate 6, a gate electrode 7, a gate insulator layer (first insulator layer) 9, a first semiconductor layer 10, and a passivation layer 11 (third insulator layer) are sequentially formed. Then, a positive type photoresist 20 is coated over the entire surface thereof, and the resist is prebaked, and ultraviolet rays 21 are irradiated from the back side of the transparent substrate 6 by using the gate electrode 7 as a mask (FIG. 11A). This resist on the substrate is developed, and the resist is removed except for the portion corresponding to the gate electrode 7 (FIG. 11B; actually by a slight overexposure, the pattern of the resist is thinned out by a very slight amount less than the width of the gate electrode). Using this resist as the etching mask, the passivation layer 11 is etched (FIG. 11C). Then, after removing the resist, a second semiconductor 12 is deposited, and the first and second semiconductor layers are etched into a desired shape, and a transparent conductive layer is deposited and a patterned, and drain electrode 13, a source electrode 14, and a pixel electrode 15 are formed, and thus, an active matrix substrate is completed (FIG. 11D).

Thus, in this embodiment, by performing photolithography by using the gate electrode 7 as the mask, an inexpensive exposure machine not requiring an alignment mechanism may be used, and the number of photolithography steps may be reduced, too. Besides, since the passivation layer 11 can be formed on the gate electrode 7 at a precision of d3 (about 1 micron), the size of the TFT can be reduced, and an active matrix substrate of a high aperture ratio and a high density may be realized.

EXAMPLE 12

FIGS. 12A–12D illustrate a twelfth embodiment in accordance with the present invention.

Figure 12A:
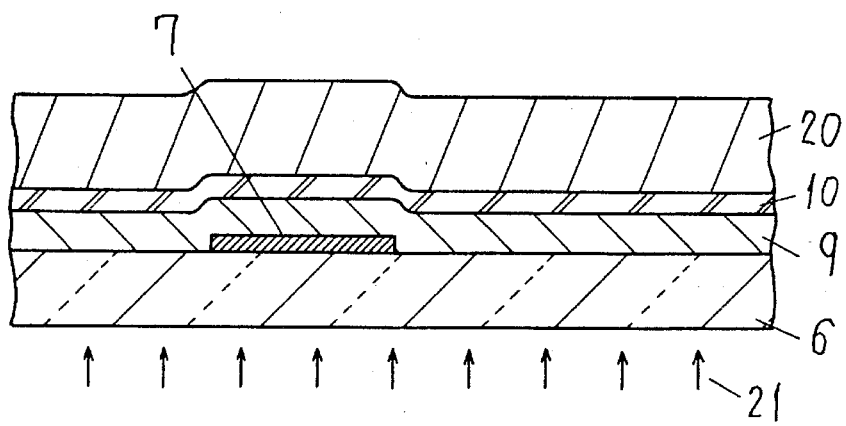
Figure 12B:
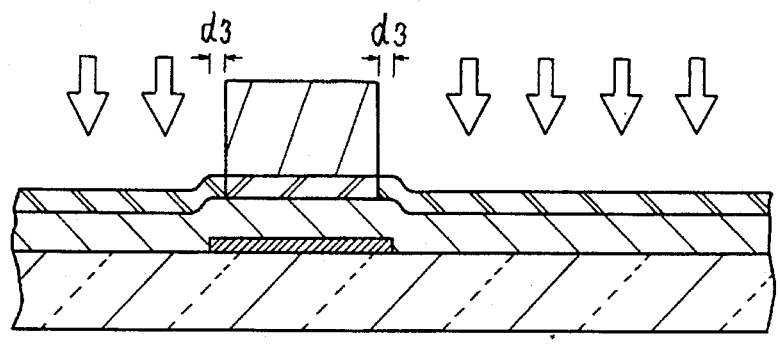
Figure 12C:
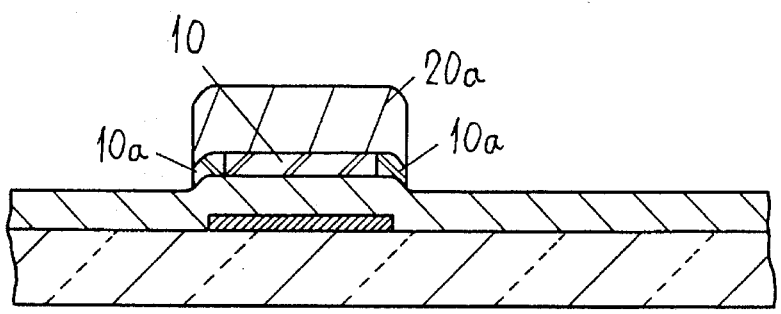
Figure 12D:
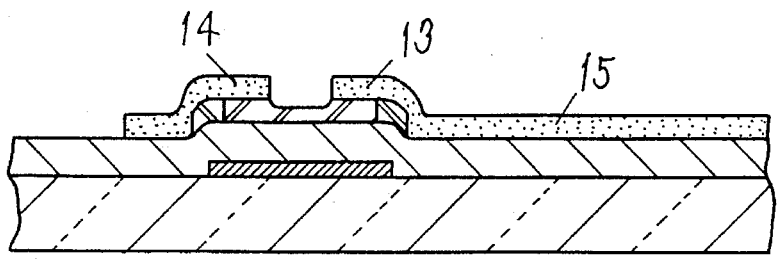

On a transparent substrate 6, a gate electrode 7, a gate insulator layer (first insulator layer) 9, and a first semiconductor layer 10 are sequentially deposited. Later, a positive type photoresist 20 is coated over the entire surface thereof, and after prebaking the resist, ultraviolet rays 21 are irradiated from the back side of the transparent substrate 6 using the gate electrode 7 as the mask (FIG. 12A). By developing this resist on the substrate, the resist is removed except for the portion corresponding to the gate electrode 7 (actually, by a slight overexposure, the pattern of the resist is thinned out by the slight portion of less than the width of the gate electrode). Using this resist as the mask, dopants are injected into the semiconductor layer in the region free from photoresist (FIG. 12B; by a plasma doping method or an ion implantation method). Afterwards, by baking the resist, the resist 20a covers parts of the doped semiconductor layer 10a (FIG. 12C). Then, the semiconductor layer not covered with the resist is etched. (FIG. 12C; a doped region 10a is left over at both sides of the semiconductor layer being etched at this time; of course, a new photoresist may be formed for this process). After removing the resist, a transparent conductive layer is deposited, and patterned, and a drain electrode 13, a source electrode 14 and a pixel electrode 15 are formed, so that an active matrix substrate is completed (FIG. 12D).

Thus, in this embodiment, when injecting dopants into the semiconductor layer, by performing photolithography by using the gate electrode 7 as the mask, an inexpensive exposure machine not requiring an alignment mechanism may be used, while the number of photolithography steps may be reduced. Besides, as compared with the conventional method, the number of layer making processes is reduced, and the size of the TFT can be reduced, so that an active matrix substrate of a high aperture ratio and a high density may be realized, while the performance may be enhanced.

EXAMPLE 13

FIGS. 13A–13D illustrate a thirteenth embodiment in accordance with the present invention.

Figure 13A:
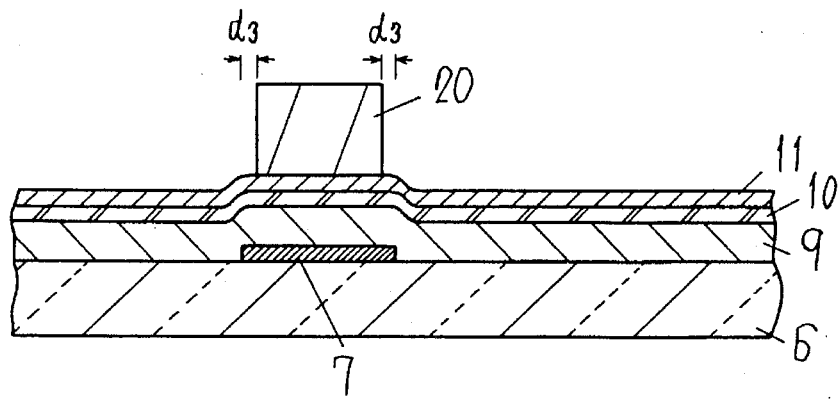
Figure 13B:
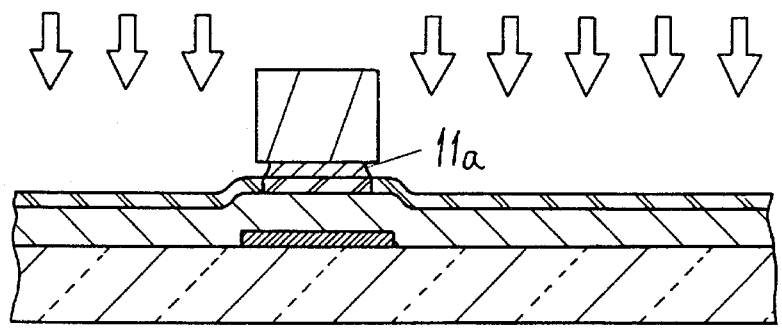
Figure 13C:
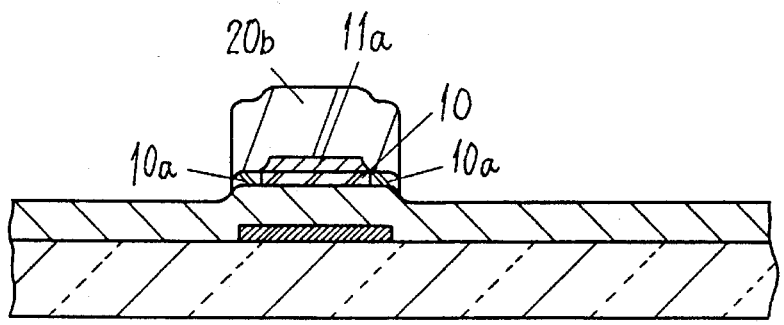
Figure 13D:
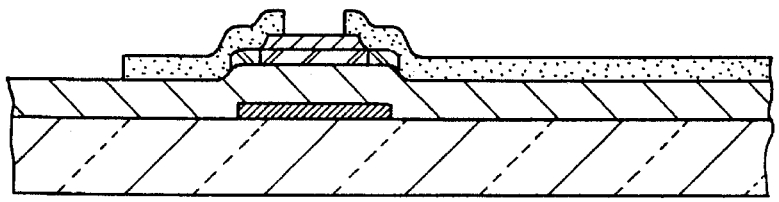
Figure 14:
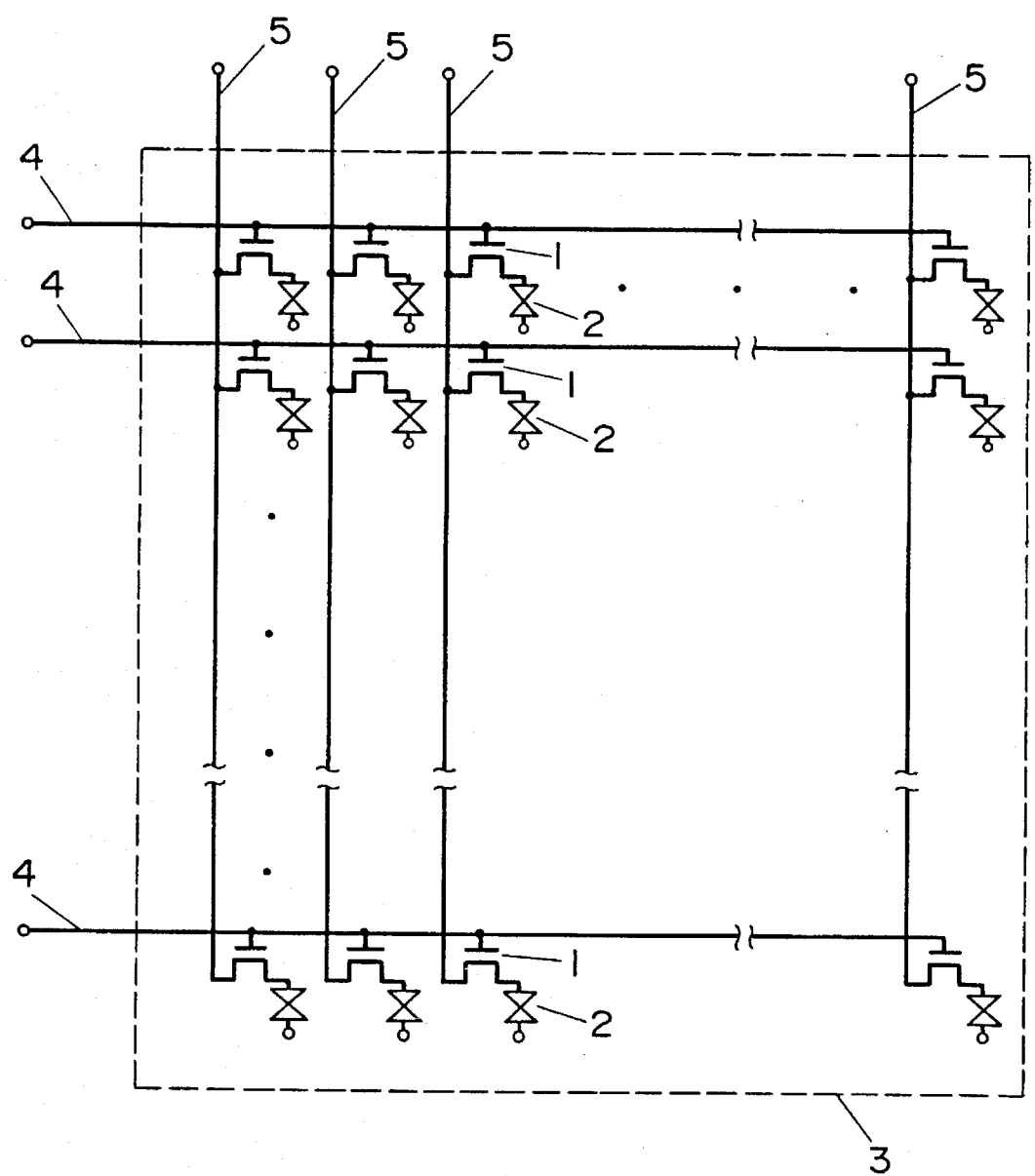
FIG. 14 is a circuit diagram of an active matrix substrate.
Figure 15A:
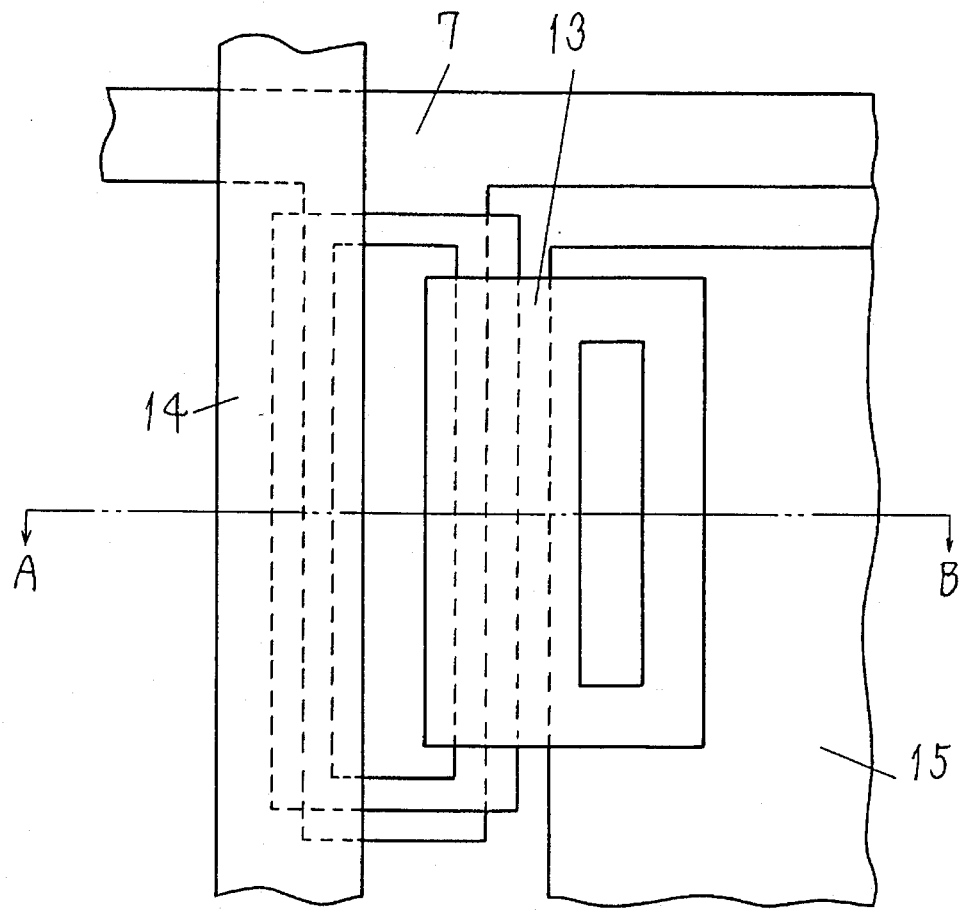
FIG. 15A is a plan view of a thin film transistor for composing a conventional active matrix substrate.
Figure 15B:
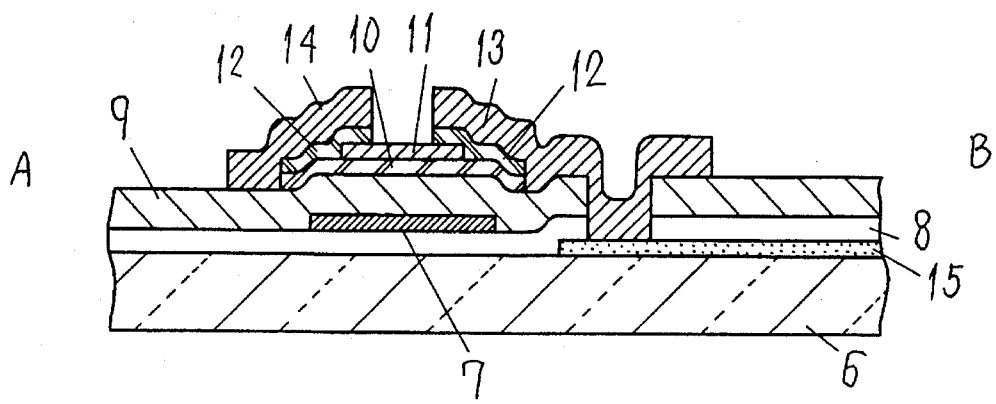
FIG. 15B is a sectional view of line A–B of FIG. 15A.
Figure 16:
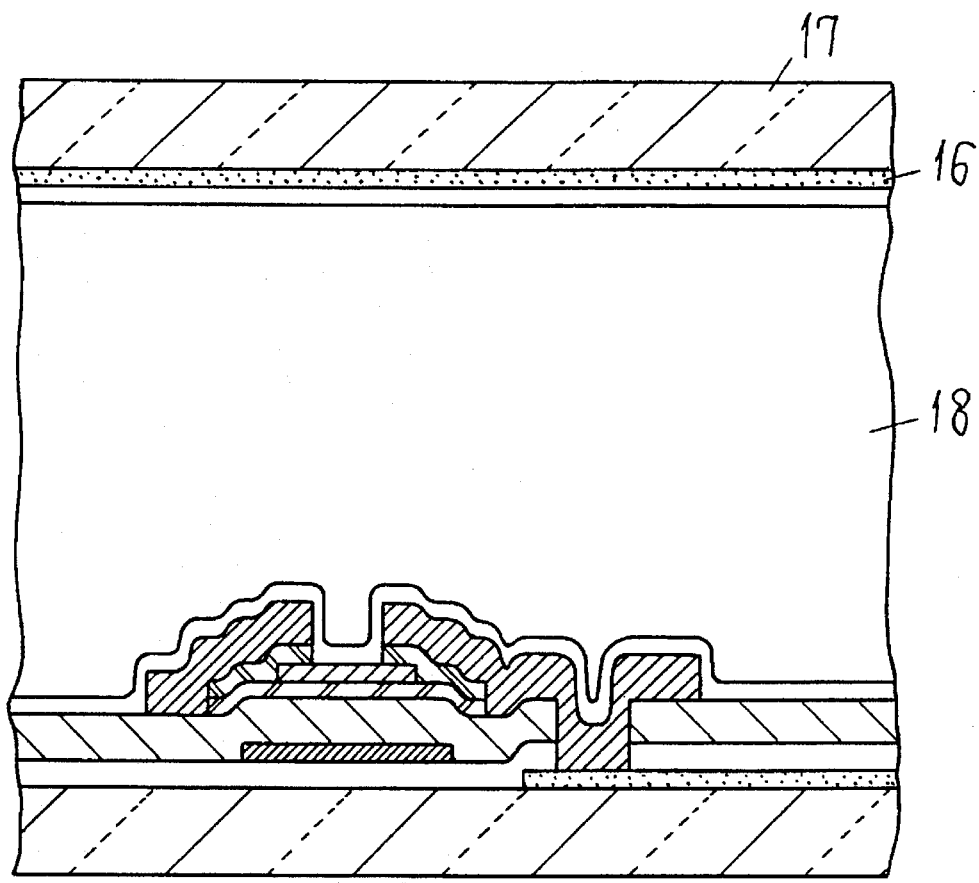
FIG. 16 is a sectional view of a conventional display device.

On a transparent substrate 6, a gate electrode 7, a gate insulator layer (first insulator layer) 9, a first semiconductor layer 10, and a passivation layer (third insulator layer) 11 are sequentially deposited. Then, a positive type photoresist 20 is coated over the entire surface thereof, and the resist is prebaked, and ultraviolet rays 21 are irradiated from the back side of the transparent substrate 6 using the gate electrode 7 as the mask. By developing this resist on the substrate, the resist is removed except for the portion corresponding to the gate electrode 7 (FIG. 13A; actually, by a slight overexposure, the pattern of the resist is thinned out by a slight portion of less than the width of the gate electrode). Using this resist as the etching mask, the passivation layer 11a is etched. At this time, by isotropic wet etching, overetching is effected. Afterwards, using the photoresist 20 as the mask, dopants are injected into the semiconductor layer in the region free from photoresist (FIG. 13B; by a plasma doping process). By baking the resist, the resist 20b covers a larger area than the passivation layer 11a. Then, the doped semiconductor layer not covered with the resist is etched (FIG. 13C; at this time the dry etching method which is an anisotropic etching means is employed; with the synergistic effect of the overetching of the passivation layer 11, a doped region 10a is securely left over at both sides of the first semiconductor layer 10 being etched). After removing the resist, a transparent conductive layer is deposited, and patterned, and a drain electrode 13, a source electrode 14 and a pixel electrode 15 are formed, so that an active matrix substrate is completed (FIG. 13D). Thus, according to this embodiment, by performing photolithography using the gate electrode 7 as a mask when forming patterns in the passivation layer 11 and injecting dopants into the semiconductor layer, an inexpensive exposure machine not requiring an alignment mechanism may be used, while the number of photolithography steps may be reduced. Besides, as compared with the conventional technique, the number of layer forming processes may be reduced. In addition, the size of the TFT may be reduced, and an active matrix substrate with a high aperture ratio and a high density may be realized, while the performance may be improved.

In the foregoing Examples 11 to 13, the pixel electrode and the drain electrode were formed simultaneously, but they may be formed separately as well. Besides, the TFT characteristics will be improved when the activation is promoted by annealing, such as laser annealing, after doping. When amorphous silicon is used as the semiconductor layer, a proper laser beam is an Ar ion laser with a wavelength of 488 nm, considering the absorption coefficient.

In the above embodiments from Example 1 to Example 13, as the gate electrode material, Cr, Ta, Ti, Mo, Ni, Ni—Cr or their metal silicides may be used. Any opaque conductive material may be employed as long as it may be used as the material for the gate electrode of the TFT. As the materials for the gate insulator layer and passivation layer, aside from silicon nitride, silicon oxide, metal oxide and other transparent insulators may be used. As the first and second semiconductor layers, amorphous silicon or phosphorus-doped amorphous silicon was used, but any semiconductor material may be equally used as long as it can obtain the required TFT characteristics and pass ultraviolet rays to a certain extent, and, for example, polycrystalline silicon or recrystallized silicon may be used. Furthermore, as the material for the pixel electrode, InOx, SnOx or transparent conductive material (ITO) of their mixed composition may be used. When forming, meanwhile, the source electrode, drain electrode and picture element electrode separately, various conductive materials (Al, Mo, Ni, other metals or their silicides) may be used as the materials for the source electrode and the drain electrode. In this case, the source and drain electrodes may be formed either in a single layer or in plural layers.

Besides, before coating the positive or negative type photoresist, by using a primer for the resist, the adhesion of the resist will be enhanced.

As clear from the embodiments illustrated and described herein, according to the method for fabricating the active matrix substrate of the invention, an inexpensive exposure machine not requiring an alignment mechanism may be used, and the photolithographic processes requiring the photomask may be reduced, so that a reduction of cost which is the greatest subject in the active matrix type liquid crystal display device may be realized. Besides, the performance of the element may be improved by employing the photolithographic process which does not require the precise alignment of the mask. Therefore, its industrial significance is extremely great.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

We claim:

1. A sequential method for fabricating an active matrix substrate comprised of a plurality of gate electrodes, in a specific region of which a slit pattern is provided, made of a non-transparent material formed on a specific region of a first side of a transparent substrate having a second side opposite said first side, a first insulating layer formed on the transparent substrate and the gate electrodes, a first semiconductor layer formed on the first insulating layer, a second semiconductor layer formed on the first semiconductor layer, and a plurality of source and drain electrodes formed on the first insulating layer and said second semiconductor layer, said method comprising at least:

a step of coating a positive photoresist layer on the second semiconductor layer, a step of light over-exposure effected from the second side of the transparent substrate, a step of developing the positive photoresist layer, and a step of overetching to remove a part of the first and second semiconductor layers by using the developed positive photoresist layer as a mask.

2. A sequential method for fabricating an active matrix substrate, comprising:

forming a plurality of gate electrodes spaced apart on a first principal surface of a transparent substrate, said gate electrodes made of a non-transparent material;

forming an insulating layer on said gate electrodes and on said first principal surface of said transparent substrate;

forming at least one semiconductor layer on said insulating layer;

forming a positive photoresist layer on said at least one semiconductor layer;

directing light onto a second principal surface of said transparent substrate which is opposite said first principal surface to effect exposure of said positive photoresist layer except for portions of said positive photoresist layer masked by said gate electrodes;

developing said positive photoresist layer and removing said positive photoresist layer except for said portions of said positive photoresist layer masked by said gate electrodes;

etching away said at least one semiconductor layer using said portions of said positive photoresist layer as a mask;

removing said portions of said positive photoresist layer; and forming source and drain electrodes electrically connected to said at least one semiconductor layer.

3. A sequential method as claimed in claim 2, wherein said forming at least one semiconductor layer includes;

forming a first semiconductor layer on said insulating layer;

forming insulating regions on said first semiconductor layer which are respectively located over said gate electrodes and which have a width which is smaller than a width of said gate electrodes; and, forming a second semiconductor layer on said insulating regions and on said first semiconductor layer.

4. A sequential method as claimed in claim 3, wherein said source and drain electrodes are made of a transparent electro-conductive material.

5. A sequential method as claimed in claim 3, further comprising forming island regions on said first principal surface of said transparent substrate which are spaced from said gate electrodes and which are made of a same material as said gate electrodes, wherein said insulating layer is formed on said island regions, said gate electrodes and said first principal surface of said transparent substrate.

6. A sequential method as claimed in claim 3, wherein said plurality of gate electrodes are formed having a predetermined slit pattern.

7. A sequential method as claimed in claim 2, wherein said forming at least one semiconductor layer comprises:

forming a first semiconductor layer on said insulating layer;

forming a second insulating layer on said first semiconductor layer;

forming a second positive photoresist layer on said second insulating layer;

directing light onto said second principal surface of said transparent substrate to effect exposure of said second positive photoresist layer except for portions of said second positive photoresist layer masked by said gate electrodes;

developing said second positive photoresist layer and removing said second positive photoresist layer except for said portions of said second positive photoresist layer masked by said gate electrodes;

etching away said second insulating layer using said portions of said second positive photoresist layer as a mask;

removing said portions of said second positive photoresist layer to expose portions of said second insulating layer; and forming a second semiconductor layer on said first semiconductor layer and on said portions of said second insulating layer.

8. A sequential method as claimed in claim 7, further comprising forming island regions on said first principal surface of said transparent substrate which are spaced from said gate electrodes and which are made of a same material as said gate electrodes, wherein said insulating layer is formed on said island regions, said gate electrodes and said first principal surface of said transparent substrate.

9. A sequential method as claimed in claim 7, wherein said plurality of gate electrodes are formed having a predetermined slit pattern.

10. A sequential method as claimed in claim 2, further comprising forming island regions on said first principal surface of said transparent substrate which are spaced from said gate electrodes and which are made of a same material as said gate electrodes, wherein said insulating layer is formed on said island regions, said gate electrodes and said first principal surface of said transparent substrate.

11. A sequential method as claimed in claim 2, wherein said plurality of gate electrodes are formed having a predetermined slit pattern.

12. A sequential method for fabricating an active matrix substrate, comprising:

forming a plurality of gate electrodes spaced apart on a first principal surface of a transparent substrate, said gate electrodes made of a non-transparent material;

forming an insulating layer on said gate electrodes and on said first principal surface of said transparent substrate;

forming at least one semiconductor layer on said insulating layer;

forming a negative photoresist layer on said at least one semiconductor layer;

directing light onto a second principal surface of said transparent substrate which is opposite said first principal surface to effect exposure of said negative photoresist layer except for portions of said negative photoresist layer masked by said gate electrodes;

developing said negative photoresist layer and removing said portions of said negative photoresist layer masked by said gate electrodes to expose portions of said at least one semiconductor layer located over said gate electrodes;

forming a conductive layer on said negative photoresist layer and on said portions of said at least one semiconductor layer;

removing said negative photoresist layer and the conductive layer formed thereon;

etching away said at least one semiconductor layer using said conductive layer formed on said portions of said at least one semiconductor layer as a mask; and forming source and drain electrodes electrically connected to said at least one semiconductor layer.

13. A sequential method as claimed in claim 12, wherein said forming at least one semiconductor layer includes;

forming a first semiconductor layer on said insulating layer;

forming insulating regions on said first semiconductor layer which respectively are located over said gate electrodes and which have a width which is smaller than a width of said gate electrodes; and, forming a second semiconductor layer on said insulating regions and on said first semiconductor layer.

14. A sequential method as claimed in claim 13, wherein said source and drain electrodes are made of a transparent electro-conductive material.

15. A sequential method as claimed in claim 12, further comprising forming island regions on said first principal surface of said transparent substrate which are spaced from said gate electrodes and which are made of a same material as said gate electrodes, wherein said insulating layer is formed on said island regions, said gate electrodes and said first principal surface of said transparent substrate.

16. A sequential method as claimed in claim 12, wherein said plurality of gate electrodes are formed having a predetermined slit pattern.

17. A sequential method for fabricating an active matrix substrate, comprising:

forming a plurality of gate electrodes spaced apart on a first principal surface of a transparent substrate;

forming a first insulating layer on said gate electrodes and on said first principal surface of said transparent substrate;

forming a first semiconductor layer on said first insulating layer;

forming a second insulating layer on said first semiconductor layer;

forming a positive photoresist layer on said second insulating layer;

directing light onto a second principal surface of said transparent substrate which is opposite said first principal surface to effect exposure of said positive photoresist except for portions of said positive layer masked by said gate electrodes;

developing said positive photoresist layer and removing said positive photoresist layer except for said portions of said positive photoresist layer masked by said gate electrodes;

etching away said second insulating layer using said portions of said positive photoresist layer as a mask;

heat treating said portions of said positive photoresist layer to cause said portions of said positive photoresist layer becomes larger;

etching away said first semiconductor layer using said portions of said positive photoresist layer as a mask;

etching away said positive photoresist layer;

forming a second semiconductor layer at least on said second insulating layer and on said first semiconductor layer;

forming source and drain electrodes on said second semiconductor layer.

* * * * *